United States Patent
Ning et al.

(10) Patent No.: US 11,494,084 B2
(45) Date of Patent: Nov. 8, 2022

(54) MANAGING DIELECTRIC STRESS OF A MEMORY DEVICE USING CONTROLLED RAMPING SLOPES

(71) Applicant: Micron Technology, Inc., Boise, ID (US)

(72) Inventors: Sheyang Ning, San Jose, CA (US); Lawrence Miranda, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/119,576

(22) Filed: Dec. 11, 2020

(65) Prior Publication Data

US 2022/0187995 A1    Jun. 16, 2022

(51) Int. Cl.
*G06F 3/06*         (2006.01)
*G11C 16/08*        (2006.01)
(Continued)

(52) U.S. Cl.
CPC .......... *G06F 3/0616* (2013.01); *G06F 3/0659* (2013.01); *G06F 3/0673* (2013.01);
(Continued)

(58) Field of Classification Search
CPC ....... G11C 11/419; G11C 7/065; G11C 16/10; G11C 11/412; G11C 11/5628; G11C 16/0483; G11C 16/26; G11C 16/34; G11C 16/3459; G11C 5/063; G11C 7/18; G11C 11/1659; G11C 11/1675; G11C 11/4063; G11C 11/407; G11C 11/41; G11C 11/5614; G11C 11/5678; G11C 14/0054; G11C 14/0063; G11C 14/0081; G11C 14/009; G11C 16/18; G11C 2013/005; G11C 2013/0085; G11C 2029/1202; G11C 2029/5006; G11C 2207/065; G11C 2207/2272; G11C 2207/2281; G11C 2211/5647; G11C 2213/82; G11C 29/00; G11C 29/026; G11C 29/04; G11C 29/12; G11C 29/12005; G11C 29/1201; G11C 29/16; G11C 29/30; G11C 29/56; G11C 29/76; G11C 29/785; G11C 5/08; G11C 8/04; G11C 8/06; G11C 11/005; G11C 11/14; G11C 13/0028; G11C 14/00; G11C 15/04; G11C 16/102; G11C 16/107;
(Continued)

(56) References Cited

U.S. PATENT DOCUMENTS 8,605,507 B2 * 12/2013 Liu ................. G11C 16/10
                                             365/185.24

OTHER PUBLICATIONS

Chuang et al., "Physically Unclonable Function Using CMOS Breakdown Position", IEEE, downloaded Oct. 9, 2020, 7 pages.

* cited by examiner

*Primary Examiner* — Thong Q Le
(74) *Attorney, Agent, or Firm* — Lowenstein Sandler LLP

(57) ABSTRACT

Control logic in a memory device identifies a request to execute a memory access operation on the memory cell. A first set of pulses corresponding to a first voltage ramp slope level is caused to be applied to the memory cell during a first time interval of the memory access operation. The control logic causes a second set of pulses corresponding to a second voltage ramp slope level to be applied to the memory cell during a second time interval of the execution of the memory access operation, wherein the first slope level and the second slope level are different.

20 Claims, 6 Drawing Sheets

(51) Int. Cl.
*G11C 16/10* (2006.01)
*G11C 16/04* (2006.01)
(52) U.S. Cl.
CPC .............. *G11C 16/08* (2013.01); *G11C 16/10* (2013.01); *G11C 16/0483* (2013.01)
(58) Field of Classification Search
CPC .... G11C 2013/0054; G11C 2013/0071; G11C 2013/008; G11C 2013/0088; G11C 2207/105; G11C 2207/2236; G11C 2211/5622; G11C 2213/31; G11C 2213/32; G11C 2213/52; G11C 2213/76; G11C 2216/16; G11C 27/02; G11C 29/38; G11C 29/78; G11C 29/808; G11C 29/84; G11C 5/00; G11C 7/1018; G11C 7/1021; G11C 7/1036; G11C 7/20; G11C 7/225; G11C 8/16
USPC ........... 365/189.05, 205, 189.15, 233.5, 156, 365/185.17, 189.08, 203, 177, 185.19, 365/185.2, 185.22, 185.24, 189.09, 365/189.11, 189.16, 190, 194, 207, 365/230.08; 327/55, 215, 208, 14, 170, 327/210, 53, 63; 711/167, 105, 104, 169, 711/5, 103, 163, 168, 100, 101, 102, 108, 711/114, 115, 162, 165, 170, 201, 711/E12.001, E12.004, E12.008
See application file for complete search history.

MANAGING DIELECTRIC STRESS OF A MEMORY DEVICE USING CONTROLLED RAMPING SLOPES

TECHNICAL FIELD

Embodiments of the disclosure relate generally to memory sub-systems, and more specifically, relate to managing dielectric stress of a memory device using controlled ramping slopes.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
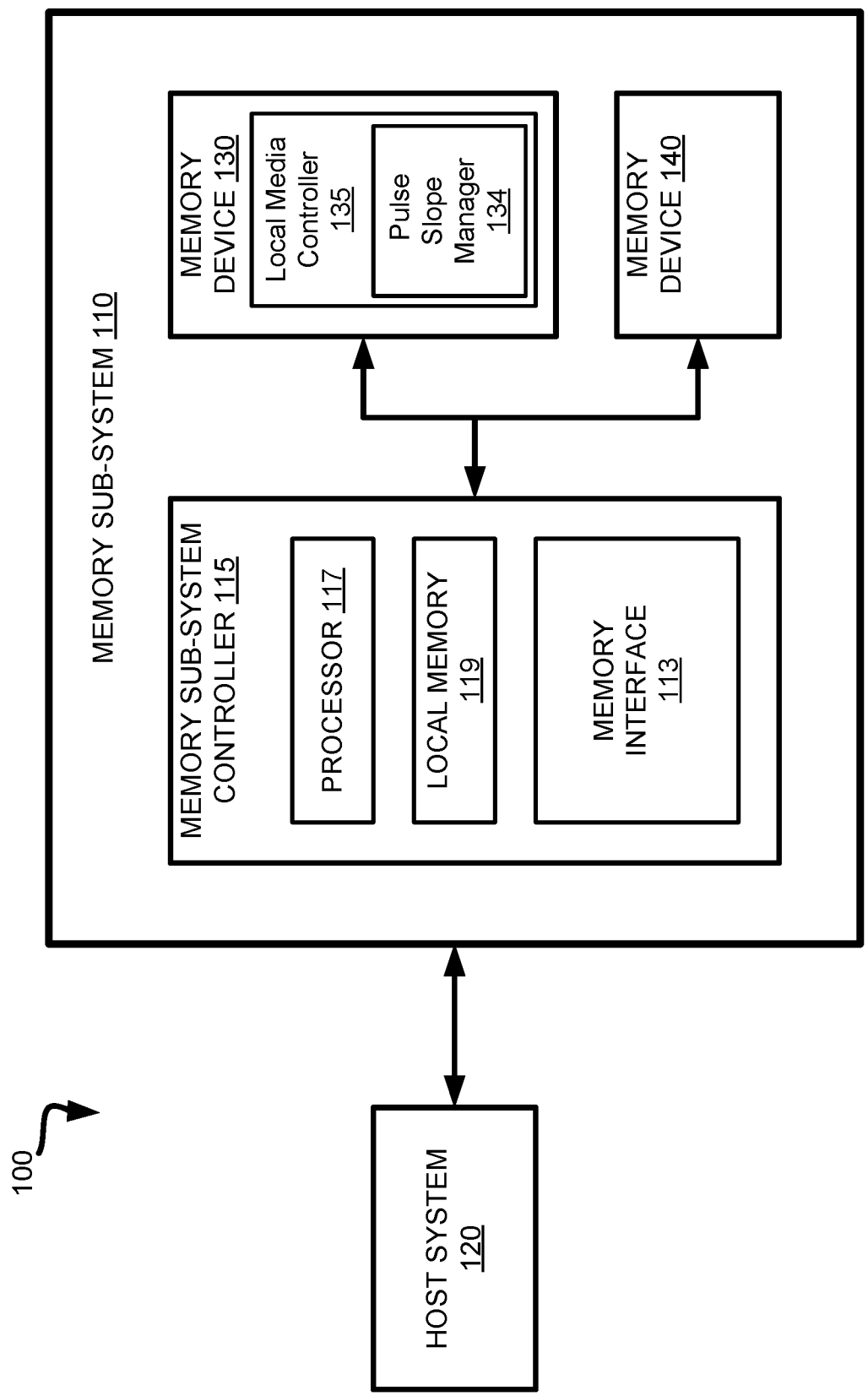
FIG. 1 illustrates an example computing system that includes a memory sub-system in accordance with some embodiments of the present disclosure.

Aspects of the present disclosure are directed to managing dielectric stress of a memory device using controlled ramping slopes. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

Memory access operations (e.g., a program operation, an erase operation, etc.) can be executed with respect to the memory cells by applying a wordline bias voltage to wordlines to which memory cells of a selected page are connected. For example, an Incremental Step Pulse Programming (ISPP) process or scheme can be employed to maintain a tight cell threshold voltage distribution for higher data reliability. In ISPP, a series of high-amplitude pulses of voltage levels having an increasing magnitude (e.g., by a predefined pulse step height) are applied to wordlines to which one or more memory cells are connected to gradually raise the voltage level of the memory cells to above a wordline voltage level corresponding memory access operation. The application of the uniformly increasing pulses by a wordline driver of the memory device enables the selected wordline to be ramped or increased to a wordline voltage level ($V_{wl}$) corresponding to a memory access operation. Similarly, a series of voltage pulses having a uniformly increasing voltage level can be applied to the wordline to ramp the wordline to the corresponding wordline voltage level during the execution of an erase operation.

During the multi-stage ramping process associated with a memory access operation (e.g., a program operation or an erase operation), the fast ramping and increase of pulse voltage levels places a high dielectric stress level on the target memory cell (e.g., stress caused by electrons being abstracted from a pillar portion of a wordline to a storage layer of the wordline through a dielectric layer). For example, in order to achieve fast programming levels, the voltage levels of the series of pulses increases rapidly over time, resulting in a steeply increasing ramping slope (e.g., the gradient of the voltage level of the pulses over time). These voltage ramping methods further result in a large delta in voltage levels between the pillar layer and the storage layer of the wordline which generates a high level of stress on the dielectric layer. Disadvantageously, peak stress levels on the dielectric layer causes breakdown and wear of the memory cell over time. In this regard, high dielectric stress levels significantly decrease endurance levels of the memory cell and lead to slower erase times during an end-of-life stage of the memory device.

Aspects of the present disclosure address the above and other deficiencies by implementing memory access operations using a controlled slope of pulse voltage levels. In one embodiment, the memory sub-system causes different ramp slope levels to be applied during different time intervals of the execution of the memory access operation (e.g., a program or erase operation). In an embodiment, multiple different sets of voltage pulses are established corresponding to different time intervals associated with execution of the memory access operation. Each set of pulses is associated with a different slope level. For example, a first set of pulses to be applied during a first time interval has a first slope level, and a second set of pulses to be applied during a second time interval has a second slope level that is different from the first slope level. In an embodiment, any number of sets of pulses each having a different predetermined or preset slope level can be established and applied during a memory access operation.

Advantages of this approach include, but are not limited to, using controlled or managed ramping slope levels to achieve fast memory access operation execution (e.g., fast programming of a memory cell) with reduced dielectric stress levels. In the manner described herein, application of controlled pulse slopes can enable desired operation times (e.g., fast programming times) using a small resistance-capacitance (RC) time constant (e.g., a lower resistance in the circuit that leads to a lower RC time constant and a faster performing memory device). Furthermore, the controlled ramping slopes result in a lower dielectric stress and an increase a time to breakdown of the dielectric. In an embodiment, the dielectric stress level is maintained at a substantially uniform dielectric stress level (e.g., a threshold range of approximately 0.3V, such as a dielectric stress level between 7.6V and 7.9V). Advantageously, this increased time to breakdown of the dielectric results in an increase in the endurance of the memory cell and faster erase times at an end-of-life stage of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a pulse slope manager 134 configured to carry out corresponding memory access operations, in response to receiving the memory access management commands from memory interface 113. In some embodiments, local media controller 135 includes at least a portion of pulse slope manager 134 and is configured to perform the functionality described herein. In some embodiments, pulse slope manager 134 is implemented on memory device 130 using firmware, hardware components, or a combination of the above. In one embodiment, pulse slope manager 134 receives, from a requestor, such as memory interface 113, a request to program data to a memory array of memory device 130. In one embodiment, the pulse slope manager 134 maintains information defining multiple sets of pulses, wherein each set of pulses corresponds to a different slope level and a time interval or time slot. In an embodiment, in response to receiving the memory access operation request, the memory access operation is initiated to ramp or increase a voltage of a memory cell to a voltage level corresponding to the memory access operation.

In an embodiment, the pulse slope manager 134 controls the application of a series of pulses (e.g., programming pulses) at respective voltage levels to ramp the memory cell to a target wordline voltage level. During a first time interval of the execution of the multi-stage ramping process (e.g., from $T_0$ to $T_1$), the pulse slope manager 134 causes a voltage driver (e.g., wordline driver) to apply a first set of pulses having a first slope level to a wordline of the target memory cell. For example, the first slope level can correspond to a first set of pulses having respective voltage levels that increase at a first rate over the first time interval.

During a second time interval (e.g., from $T_1$ to $T_2$), the pulse slope manager 134 causes the application of a second set of pulses having a second slope level to the target memory cell, wherein the second slope level is different than the first slope level. For example, the second slope level can correspond to a second set of pulses having respective voltage levels that increase at a second rate over the second time interval, where the second rate is less than or greater than the first rate. In an embodiment, the pulse slope manager 134 can cause any number of different sets of pulses (having different ramping slopes) during respective time intervals of the execution of the memory access operation until the wordline voltage level is reached (e.g., the wordline voltage level associated with a program operation or an erase operation). Further details with regard to the operations of pulse slope manager 134 are described below.

Figure 2:
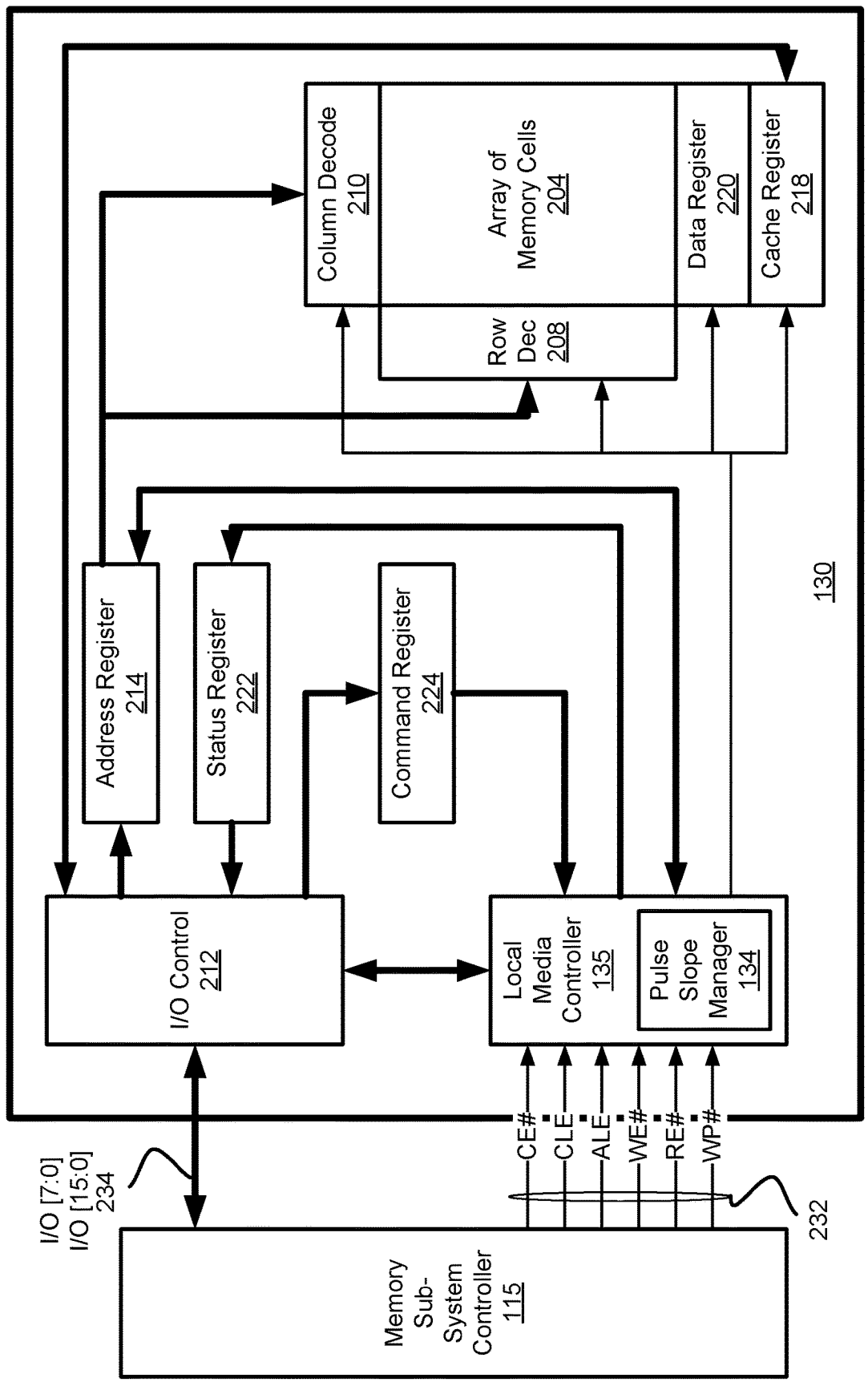
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 135 includes pulse slope manager 134, which can implement the application of sets of pulses having controlled ramping slopes during time intervals of a memory access operation (e.g., programming or erasing) of memory device 130, as described herein.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 220 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figure 3:
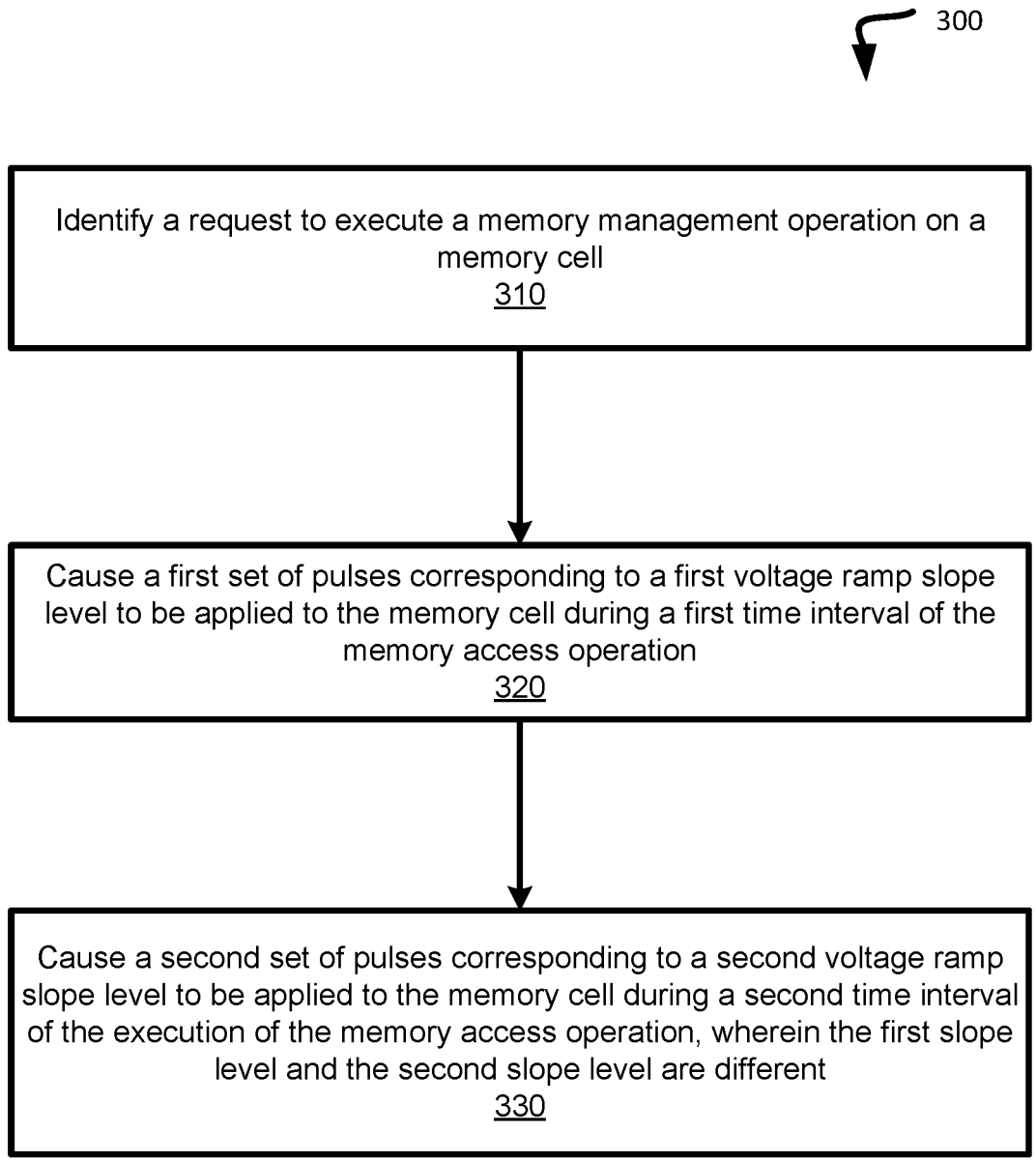
FIG. 3 is a flow diagram of an example method of executing a memory access operation using a controlled pulse voltage ramping slope applied to a memory cell of a memory device in accordance with some embodiments of the present disclosure.

FIG. 3 is a flow diagram of an example method of double interleaved programming of a memory device in a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by pulse slope manager 134 of FIG. 1 and FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, a command/request is received. For example, processing logic (e.g., pulse slope manager 134) can receive, from a requestor, such as a memory interface 113 of a memory sub-system controller 115, a request to perform a memory access operation on a memory cell, such as a memory cell of the memory array 250, of a memory device, such as memory device 130. In one embodiment, the memory access operation includes a program operation. In an embodiment, the memory access operation includes an erase operation associated with a target memory cell. In an embodiment, the memory access operation (e.g., a program operation) includes ramping a voltage of the memory cell At operation 320, a first set of pulses are caused to be applied. For example, the processing logic can cause a first set of pulses corresponding to a first voltage ramp slope level to be applied to the memory cell during a first time interval of the memory management operation (e.g., a first stage of a multi-stage ramping process). In an embodiment, the processing logic initiates the multi-stage ramping process to ramp or increase the voltage of the memory cell to the voltage level by applying multiple sets of pulses. In an embodiment, the first set of pulses includes multiple pulses having respective voltage levels that are applied to a wordline of the memory cell to ramp the memory cell to the wordline voltage level associated with the memory access operation. In an embodiment, the first set of pulses is associated with a first slope level. The first slope level represents a gradient or change in the voltage levels of the first set of pulse during the first time interval (e.g., between $T_0$ (e.g., a start time of the ramping process) to $T_1$).

In an embodiment, the processing logic can maintain and reference a data structure including information identifying each of the slope levels for the respective sets of pulses and a corresponding time interval. For example, the data structure can include information identifying a first slope level for a first set of pulses to be applied during a first time interval, a second slope level for a second set of pulses to be applied during a second time interval, a third slope level for a third set of pulses to be applied during a third time interval, and so on for any number of pre-designated or preset slope levels to be applied during the ramping process.

Figure 4:
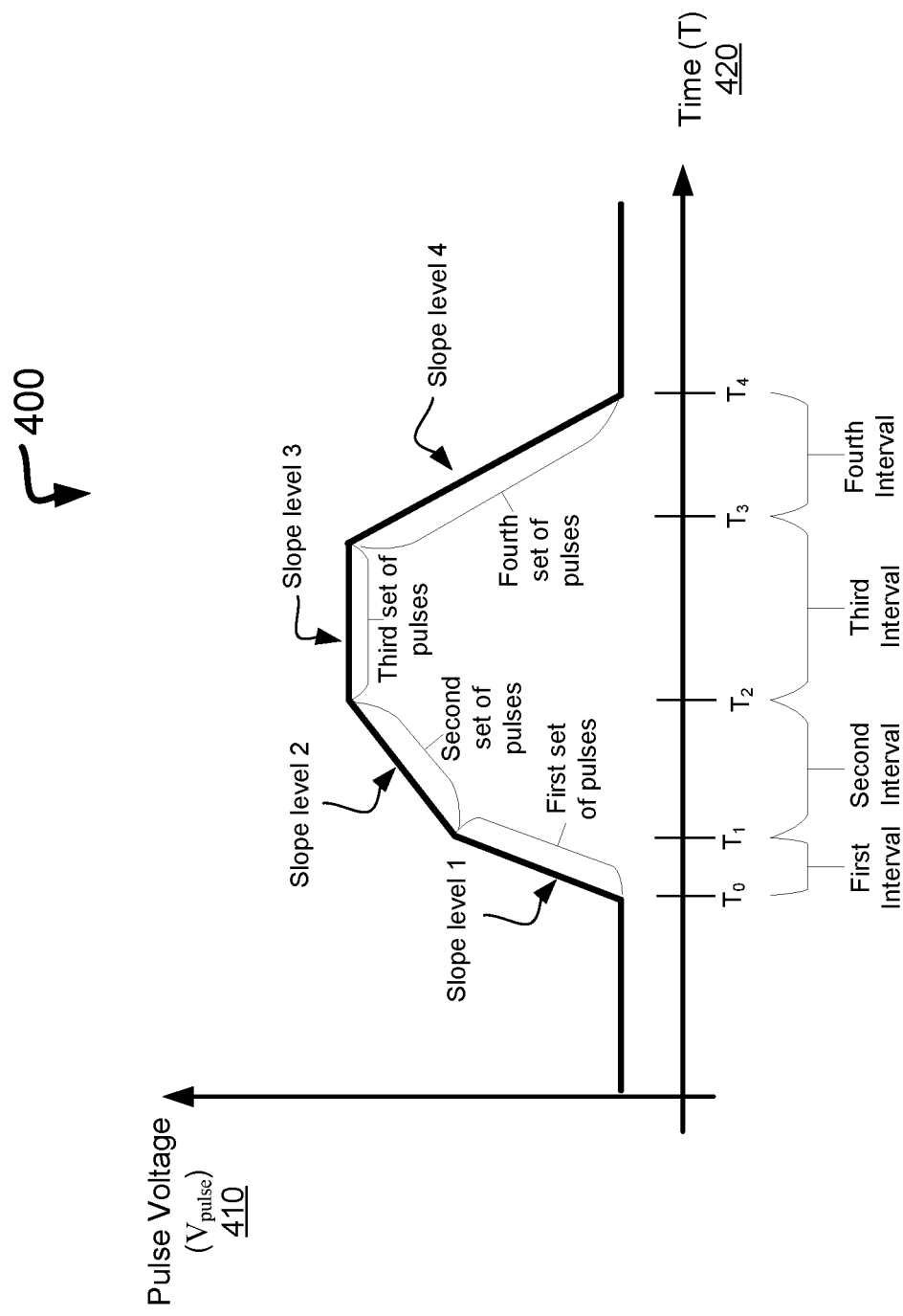
FIG. 4 is a graph illustrating controlled pulse voltage ramping slopes applied during different time intervals of a memory access operation of a memory device in a memory sub-system in accordance with some embodiments of the present disclosure.

In an embodiment, the first slope level can represent a first rate of change of the voltage levels corresponding to the respective pulses in the first set of pulses applied over time during the first time interval (e.g., a positive or negative slope of the voltage levels over the time interval). FIG. 4 illustrates an example graph 400 of voltage levels corresponding to pulses 410 (e.g., $V_{pulse}$) applied over time (T) 420 during a ramping process of a memory access operation as executed by the processing logic. As shown in FIG. 4, during the first time interval, the first set of pulses is applied. As shown in FIG. 4, the first set of pulses has a first slope level (e.g., slope level 1) as set by the processing logic during this phase of the ramping process.

At operation 330, a second set of pulses are caused to be applied. For example, the processing logic can cause a second set of pulses corresponding to a second voltage ramp slope level to be applied to the memory cell during a second time interval of the memory management operation. In an embodiment, the second set of pulses includes multiple pulses having respective voltage levels that are applied to the wordline of the memory cell to continue to ramp the memory cell to the wordline voltage level associated with the memory access operation. In an embodiment, the second set of pulses is associated with a second slope level which is different than the first slope level associated with the first set of pulses. The second slope level represents a gradient or change in the voltage levels of the second set of pulse during the second time interval (e.g., between $T_1$ and $T_2$).

In an embodiment, the processing logic can monitor or track clock information associated with the ramping process to determine when a stage transition time has been reached. For example, a first stage transition time can be set to $T_1$, a second stage transition time can be set to $T_2$, a third stage transition time can be set to $T_3$, and so on. In an embodiment, upon determining that the first stage transition time has been reached (e.g., at time $T_1$), the processing logic can cause the application of the second set of pulses to the target memory cell. In an embodiment, the second set of pulses includes a series of pulses sent in time increments during the second time interval having voltage levels that correspond to the second slope level. As shown in the example of FIG. 4, during the second interval (e.g., between $T_1$ and $T_2$), the second set of pulses having the second slope level (e.g., slope level 2) is applied to the target memory cell. Also as shown in FIG. 4, slope level 1 and slope level 2 are different. In the example shown in FIG. 4, slope level 1 is higher than slope level 2. In an embodiment, the second slope level can be determined by the processing logic by performing a look-up operation of the data structure including the multiple slope levels corresponding to the multiple stages of the ramping process.

In an embodiment, the processing logic can cause the application of any number of sets of pulses to ramp the voltage of the memory cell to the wordline voltage level associated with the requested memory access operation. As shown in FIG. 4, the ramping process can include the application of a third set of pulses (e.g., during a third interval between $T_2$ and $T_3$) and a fourth set of pulses (e.g., during a fourth interval between $T_3$ and $T_4$). As illustrated in the example of FIG. 4, the multiple stages of the ramping process include different sets of pulses applied at voltage levels corresponding to different slope levels.

Figure 5:
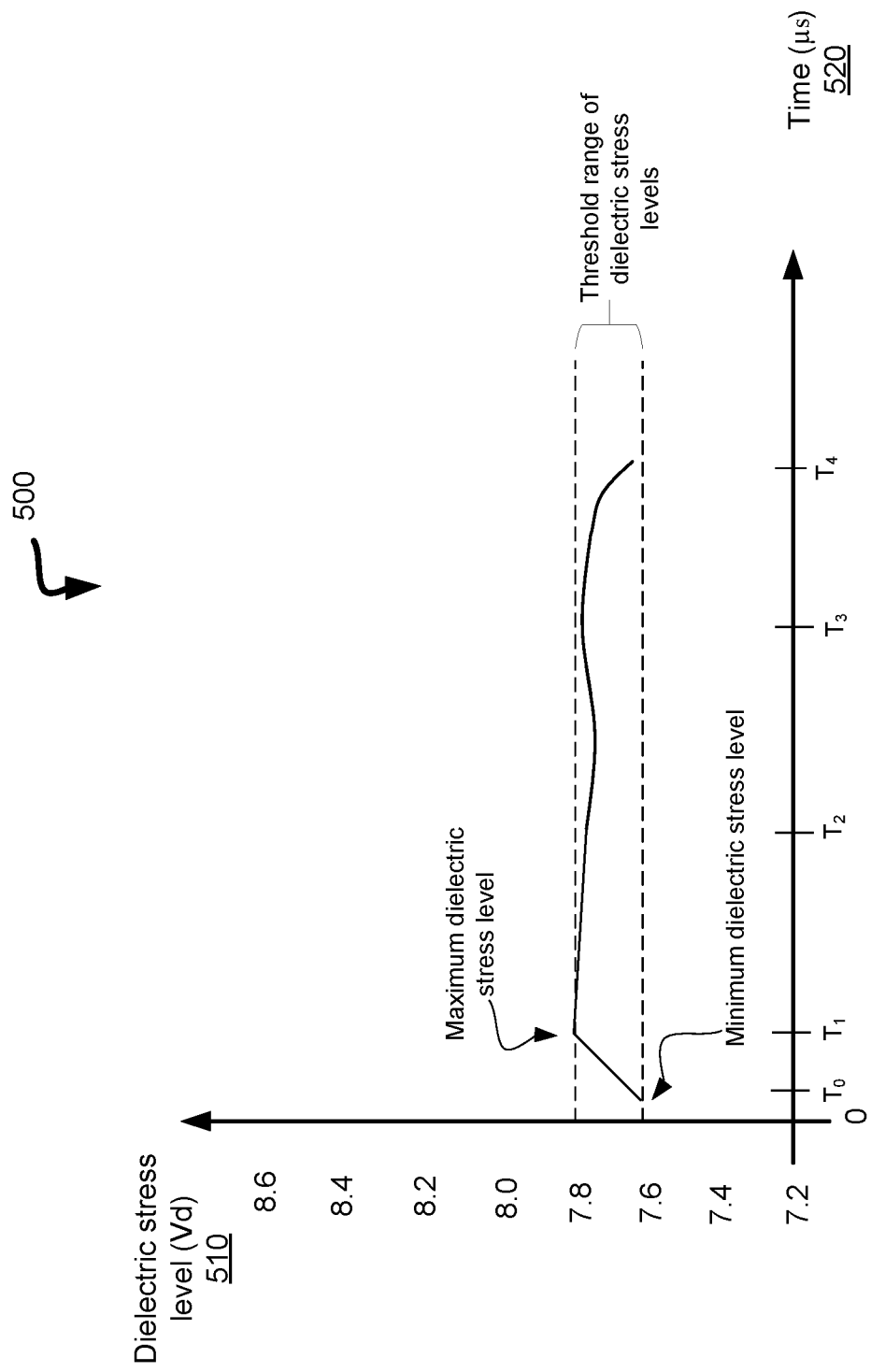
FIG. 5 is a graph illustrating a dielectric stress level over time during execution of a memory access operation using controlled pulse voltage ramping slopes applied to a memory device in a memory sub-system in accordance with some embodiments of the present disclosure.

Advantageously, controlling the different sets of pulse voltage levels in accordance with the various slope levels during the ramping of the memory cell enables fast ramping as part of memory access operation execution (e.g., fast programming times), while reducing a level of dielectric stress associated with the abstraction of electrons from a pillar to a storage layer through the dielectric layer of the memory cell. In an embodiment, the slope levels for the respective sets of pulses are derived to establish a substantially constant or fixed dielectric stress level. For example, FIG. 5 illustrates an example graph 500 of a dielectric stress level ($V_d$) 510 over time 520 during a multi-stage ramping process using sets of pulses having controlled slope levels. As shown in FIG. 5, the dielectric stress level is maintained in a relatively constant range from $T_0$ (e.g., a starting time of the ramping process) to $T_4$ (an ending time of the ramping process when the wordline voltage level is reached). Advantageously, maintaining a fixed or uniform dielectric stress level avoids peak stress on the dielectric layer associated with conventional ramping (e.g., ramping without controlled slope levels). The avoidance of peak dielectric stress results in a longer endurance of the memory cell and faster erase times at an end-of-life stage of the memory device.

In an embodiment, the substantially uniform dielectric stress level exhibited during the ramping process is within a threshold range. As shown in FIG. 5, a difference between a minimum stress level and a maximum stress level applied to the dielectric layer of the memory cell during execution of the memory access operation is within a threshold range (e.g., a range of 0.3V such as 7.6V to 7.9V). Advantageously, as shown in FIG. 5, the dielectric stress levels exhibited during the ramping process (e.g., between $T_0$ and $T_4$) are substantially uniform and within the desired threshold range.

Figure 6:
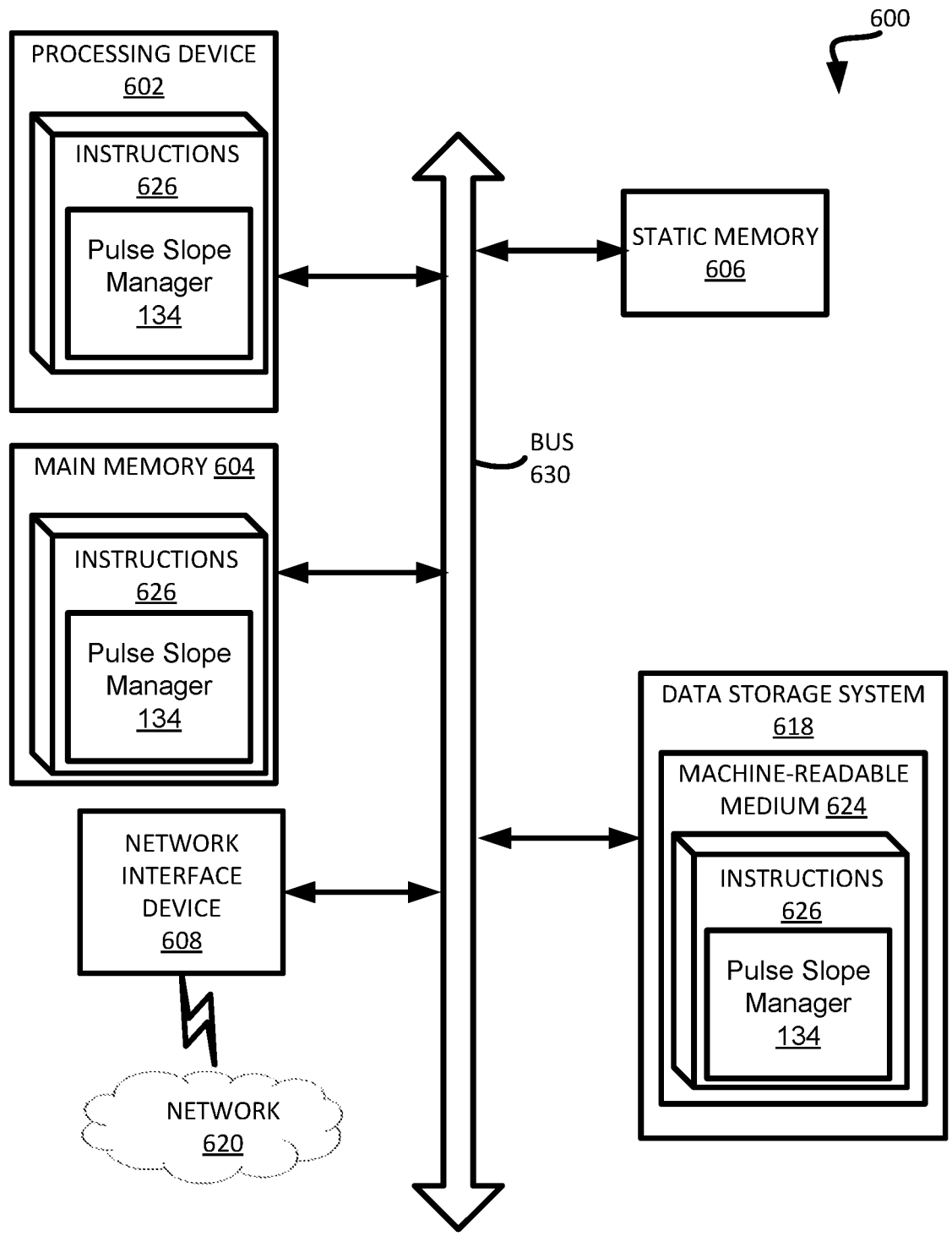
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to pulse slope manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium, such as a non-transitory computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to pulse slope manager 134 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a memory cell; and
control logic, operatively coupled with the memory array, to perform operations comprising:
identifying a request to execute a memory access operation on the memory cell;
causing a first set of pulses corresponding to a first voltage ramp slope level to be applied to the memory cell during a first time interval of the memory access operation;
monitoring clock information associated with the memory access operation to determine that a transition time has been reached, wherein the transition time is associated with an end of the first time interval; and
in response to determining that the transition time has been reached, causing a second set of pulses corresponding to a second voltage ramp slope level to be applied to the memory cell during a second time interval of the memory access operation, wherein the first voltage ramp slope level and the second voltage ramp slope level are different.

2. The memory device of claim 1, wherein the memory cell comprises a pillar, a storage layer, and a dielectric layer, wherein a substantially uniform stress level is applied to the dielectric layer during execution of the memory access operation.

3. The memory device of claim 1, wherein a difference between a minimum stress level and a maximum stress level applied to a dielectric layer of the memory cell during the memory access operation is within a threshold range.

4. The memory device of claim 1, wherein the first voltage ramp slope level is higher than the second voltage ramp slope level.

5. The memory device of claim 1, wherein the control logic is to perform further operations comprising:
causing a third set of pulses corresponding to a third voltage ramp slope level to be applied to the memory cell during a third time interval of the memory access operation, wherein the third voltage ramp slope level is different than the first voltage ramp slope level and the second voltage ramp slope level.

6. The memory device of claim 5, wherein the control logic is to perform further operations comprising:
causing a fourth set of pulses corresponding to a fourth voltage ramp slope level to be applied to the memory cell during a fourth time interval of the memory access operation, wherein the fourth voltage ramp slope level is different than the first voltage ramp slope level, the second voltage ramp slope level, and the third voltage ramp slope level.

7. The memory device of claim 6, wherein a target wordline voltage level is established for the memory cell following application of the fourth set of pulses.

8. A non-transitory computer readable medium comprising instructions, which when executed by a processing device, cause the processing device to perform operations comprising:
receiving a request to execute a program operation on a memory cell; and causing a plurality of sets of programming pulses to be applied to the memory cell to ramp the memory cell to a wordline voltage level during execution of the program operation, wherein each of the plurality of sets of programming pulses corresponds to a different slope level and a different transition time of a set of transition times.

9. The non-transitory computer readable medium of claim 8, wherein the plurality of sets of programming pulses comprises a first set of programming pulses corresponding to a first slope level and a second set of programming pules corresponding to a second slope level.

10. The non-transitory computer readable medium of claim 9, wherein the first set of programming pulses is applied to the memory cell during a first time interval and the second set of programming pulses is applied to the memory cell during a second time interval.

11. The non-transitory computer readable medium of claim 9, wherein a difference between a minimum stress level and a maximum stress level applied to a dielectric layer of the memory cell during the execution of the program operation is within a threshold range.

12. The non-transitory computer readable medium of claim 8, wherein a data structure is established comprising information identifying the plurality of sets of programming pulses and the set of transitions times.

13. The non-transitory computer readable medium of claim 12, wherein the operations further comprise:
identifying a first stage transition time of the set of transition times;
applying the first set of programming pulses during a first time interval between the first stage transition time and a second stage transition time;
identifying the second stage transition time of the set of transition times; and
applying the second set of programming pulses during a second time interval starting at the second stage transition time.

14. A method comprising:
identifying, by a processing device, a request to execute a memory access operation on a memory cell;
causing a first set of pulses corresponding to a first voltage ramp slope level to be applied to the memory cell during a first time interval of the memory access operation;
monitoring clock information associated with the memory access operation to determine that a transition time has been reached, wherein the transition time is associated with an end of the first time interval; and
in response to determining that the transition time has been reached, causing a second set of pulses corresponding to a second voltage ramp slope level to be applied to the memory cell during a second time interval of the memory access operation, wherein the first voltage ramp slope level and the second voltage ramp slope level are different.

15. The method of claim 14, wherein the memory cell comprises a pillar, a storage layer, and a dielectric layer, wherein a substantially uniform stress level is applied to the dielectric layer during the memory access operation.

16. The method of claim 14, wherein a difference between a minimum stress level and a maximum stress level applied to a dielectric layer of the memory cell during the memory access operation is within a threshold range.

17. The method of claim 14, wherein the first voltage ramp slope level is higher than the second voltage ramp slope level.

18. The method of claim 14, further comprising:
causing a second set of pulses corresponding to a third voltage ramp slope level to be applied to the memory cell during a third time interval of the memory access operation, wherein the third voltage ramp slope level is different than the first voltage ramp slope level and the second voltage ramp slope level.

19. The method of claim 18, further comprising:
causing a fourth set of pulses corresponding to a fourth voltage ramp slope level to be applied to the memory cell during a fourth time interval of the memory access operation, wherein the fourth voltage ramp slope level is different than the first voltage ramp slope level, the second voltage ramp slope level, and the third voltage ramp slope level.

20. The method of claim 19, wherein a target wordline voltage level is established for the memory cell following application of the fourth set of pulses.

* * * * *